United States Patent
Dunn et al.

(10) Patent No.: US 11,022,635 B2
(45) Date of Patent: Jun. 1, 2021

(54) MEASURING POWER CONSUMPTION OF AN ELECTRONIC DISPLAY ASSEMBLY

(71) Applicant: Manufacturing Resources International, Inc., Alpharetta, GA (US)

(72) Inventors: William Dunn, Alpharetta, GA (US); John Schuch, Buford, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 16/744,318

(22) Filed: Jan. 16, 2020

(65) Prior Publication Data
US 2020/0150162 A1    May 14, 2020

Related U.S. Application Data

(62) Division of application No. 15/972,904, filed on May 7, 2018, now Pat. No. 10,578,658.

(51) Int. Cl.
*H05B 45/00* (2020.01)
*G09G 3/34* (2006.01)
(Continued)

(52) U.S. Cl.
CPC .......... *G01R 22/061* (2013.01); *G01R 22/10* (2013.01); *G09G 2330/021* (2013.01); *H04L 67/12* (2013.01)

(58) Field of Classification Search
CPC ..... G09G 2360/144; G09G 2320/0626; G09G 3/3406; G09G 2360/145; H05B 47/10;
(Continued)

(56) References Cited

U.S. PATENT DOCUMENTS 4,093,355 A    6/1978   Kaplit et al.
4,593,978 A    6/1986   Mourey et al.
(Continued)

FOREIGN PATENT DOCUMENTS

AU    2010218083 B2    10/2016
AU    2016203550 B2    3/2018
(Continued)

OTHER PUBLICATIONS

Novitsky, T. et al., Design How-To, Driving LEDs versus CCFLs for LCD backlighting, EE Times, Nov. 12, 2007, 6 pages, AspenCore.
(Continued)

*Primary Examiner* — Alesa Allgood
(74) *Attorney, Agent, or Firm* — Standley Law Group LLP; Jeffrey S. Standley; Adam J. Smith

(57) ABSTRACT

Methods for measuring power consumption include providing an assembly with electronic display subassemblies at a housing. The subassemblies each include light sources behind or adjacent to an electronic display layer and electricity consuming components. A simulated electric meter is electrically interposed between a utility electric supply and the electricity consuming components. The simulated electric meter includes a processor, an electronic storage device, and a current sensor. The assembly is operated. Current measurements are taken at the simulated electric meter. The power consumed is determined by multiplying each of the one or more current measurements with a predetermined amount or measurements from a voltage sensor to determine one or more power consumption measures.

20 Claims, 9 Drawing Sheets

(51) Int. Cl.
    *G01R 22/06*     (2006.01)
    *G01R 22/10*     (2006.01)
    *H04L 29/08*     (2006.01)

(58) Field of Classification Search
    CPC . Y02B 20/40; G02F 1/1336; G02F 1/133602; G01R 22/06; G01R 22/061
    See application file for complete search history.

(56) References Cited

U.S. PATENT DOCUMENTS

| | | | |
|---|---|---|---|
| 4,634,225 | A | 1/1987 | Haim et al. |
| 5,029,982 | A | 7/1991 | Nash |
| 5,086,314 | A | 2/1992 | Aoki et al. |
| 5,088,806 | A | 2/1992 | McCartney et al. |
| 5,162,785 | A | 11/1992 | Fagard |
| 5,247,374 | A | 9/1993 | Terada |
| 5,559,614 | A | 9/1996 | Urbish et al. |
| 5,661,374 | A | 8/1997 | Cassidy et al. |
| 5,748,269 | A | 5/1998 | Harris et al. |
| 5,767,489 | A | 6/1998 | Ferrier |
| 5,783,909 | A | 7/1998 | Hochstein |
| 5,786,801 | A | 7/1998 | Ichise |
| 5,808,418 | A | 9/1998 | Pitman et al. |
| 5,818,010 | A | 10/1998 | McCann |
| 5,952,992 | A | 9/1999 | Helms |
| 5,991,153 | A | 11/1999 | Heady et al. |
| 6,085,152 | A | 7/2000 | Doerfel |
| 6,089,751 | A | 7/2000 | Conover et al. |
| 6,144,359 | A | 11/2000 | Grave |
| 6,153,985 | A | 11/2000 | Grossman |
| 6,157,143 | A | 12/2000 | Bigio et al. |
| 6,157,432 | A | 12/2000 | Helbing |
| 6,181,070 | B1 | 1/2001 | Dunn et al. |
| 6,191,839 | B1 | 2/2001 | Briley et al. |
| 6,259,492 | B1 | 7/2001 | Imoto et al. |
| 6,292,228 | B1 | 9/2001 | Cho |
| 6,297,859 | B1 | 10/2001 | George |
| 6,380,853 | B1 | 4/2002 | Long et al. |
| 6,388,388 | B1 | 5/2002 | Weindorf et al. |
| 6,400,101 | B1 | 6/2002 | Biebl et al. |
| 6,417,900 | B1 | 7/2002 | Shin et al. |
| 6,496,236 | B1 | 12/2002 | Cole et al. |
| 6,509,911 | B1 | 1/2003 | Shimotono |
| 6,535,266 | B1 | 3/2003 | Nemeth et al. |
| 6,556,258 | B1 | 4/2003 | Yoshida et al. |
| 6,628,355 | B1 | 9/2003 | Takahara |
| 6,701,143 | B1 | 3/2004 | Dukach et al. |
| 6,712,046 | B2 | 3/2004 | Nakamichi |
| 6,753,661 | B2 | 6/2004 | Muthu et al. |
| 6,753,842 | B1 | 6/2004 | Williams et al. |
| 6,762,741 | B2 | 7/2004 | Weindorf |
| 6,798,341 | B1 | 9/2004 | Eckel et al. |
| 6,809,718 | B2 | 10/2004 | Wei et al. |
| 6,812,851 | B1 | 11/2004 | Dukach et al. |
| 6,813,375 | B2 | 11/2004 | Armato, III et al. |
| 6,839,104 | B2 | 1/2005 | Taniguchi et al. |
| 6,850,209 | B2 | 2/2005 | Mankins et al. |
| 6,885,412 | B2 | 4/2005 | Ohnishi et al. |
| 6,886,942 | B2 | 5/2005 | Okada et al. |
| 6,891,135 | B2 | 5/2005 | Pala et al. |
| 6,943,768 | B2 | 9/2005 | Cavanaugh et al. |
| 6,982,686 | B2 | 1/2006 | Miyachi et al. |
| 6,996,460 | B1 | 2/2006 | Krahnstoever et al. |
| 7,015,470 | B2 | 3/2006 | Faytlin et al. |
| 7,038,186 | B2 | 5/2006 | De Brabander et al. |
| 7,064,733 | B2 | 6/2006 | Cok et al. |
| 7,083,285 | B2 | 8/2006 | Hsu et al. |
| 7,136,076 | B2 | 11/2006 | Evanicky et al. |
| 7,174,029 | B2 | 2/2007 | Agostinelli et al. |
| 7,176,640 | B2 | 2/2007 | Tagawa |
| 7,236,154 | B1 | 6/2007 | Kerr et al. |
| 7,307,614 | B2 | 12/2007 | Vinn |
| 7,324,080 | B1 | 1/2008 | Hu et al. |
| 7,330,002 | B2 | 2/2008 | Joung |
| 7,354,159 | B2 | 4/2008 | Nakamura et al. |
| 7,447,018 | B2 | 11/2008 | Lee et al. |
| 7,474,294 | B2 | 1/2009 | Leo et al. |
| 7,480,042 | B1 | 1/2009 | Phillips et al. |
| 7,518,600 | B2 | 4/2009 | Lee |
| 7,595,785 | B2 | 9/2009 | Jang |
| 7,639,220 | B2 | 12/2009 | Yoshida et al. |
| 7,659,676 | B2 | 2/2010 | Hwang |
| 7,692,621 | B2 | 4/2010 | Song |
| 7,724,247 | B2 | 5/2010 | Yamazaki et al. |
| 7,795,574 | B2 | 9/2010 | Kennedy et al. |
| 7,795,821 | B2 | 9/2010 | Jun |
| 7,800,706 | B2 | 9/2010 | Kim et al. |
| 7,804,477 | B2 | 9/2010 | Sawada et al. |
| 7,982,706 | B2 | 7/2011 | Ichikawa et al. |
| 8,087,787 | B2 | 1/2012 | Medin |
| 8,111,371 | B2 | 2/2012 | Suminoe et al. |
| 8,125,163 | B2 | 2/2012 | Dunn et al. |
| 8,144,110 | B2 | 3/2012 | Huang |
| 8,175,841 | B2 | 5/2012 | Ooghe |
| 8,194,031 | B2 | 6/2012 | Yao et al. |
| 8,248,203 | B2 | 8/2012 | Hanwright et al. |
| 8,325,057 | B2 | 12/2012 | Salter |
| 8,352,758 | B2 | 1/2013 | Atkins et al. |
| 8,508,155 | B2 | 8/2013 | Schuch |
| 8,569,910 | B2 | 10/2013 | Dunn et al. |
| 8,605,121 | B2 | 12/2013 | Chu et al. |
| 8,700,226 | B2 | 4/2014 | Schuch et al. |
| 8,797,372 | B2 | 8/2014 | Liu |
| 8,810,501 | B2 | 8/2014 | Budzelaar et al. |
| 8,823,630 | B2 | 9/2014 | Roberts et al. |
| 8,829,815 | B2 | 9/2014 | Dunn et al. |
| 8,895,836 | B2 | 11/2014 | Amin et al. |
| 8,901,825 | B2 | 12/2014 | Reed |
| 8,982,013 | B2 | 3/2015 | Sako et al. |
| 8,983,385 | B2 | 3/2015 | Macholz |
| 8,988,011 | B2 | 3/2015 | Dunn |
| 9,030,129 | B2 | 5/2015 | Dunn et al. |
| 9,167,655 | B2 | 10/2015 | Dunn et al. |
| 9,286,020 | B2 | 3/2016 | Dunn et al. |
| 9,400,192 | B1 | 7/2016 | Salser, Jr. et al. |
| 9,448,569 | B2 | 9/2016 | Schuch et al. |
| 9,451,060 | B1 | 9/2016 | Bowers et al. |
| 9,516,485 | B1 | 12/2016 | Bowers et al. |
| 9,536,325 | B2 | 1/2017 | Bray et al. |
| 9,622,392 | B1 | 4/2017 | Bowers et al. |
| 9,799,306 | B2 | 10/2017 | Dunn et al. |
| 9,867,253 | B2 | 1/2018 | Dunn et al. |
| 9,881,528 | B2 | 1/2018 | Dunn |
| 9,924,583 | B2 | 3/2018 | Schuch et al. |
| 10,255,884 | B2 | 4/2019 | Dunn et al. |
| 10,321,549 | B2 | 6/2019 | Schuch et al. |
| 10,412,816 | B2 | 9/2019 | Schuch et al. |
| 10,440,790 | B2 | 10/2019 | Dunn et al. |
| 2002/0009978 | A1 | 1/2002 | Dukach et al. |
| 2002/0020090 | A1 | 2/2002 | Sanders |
| 2002/0050974 | A1 | 5/2002 | Rai et al. |
| 2002/0065046 | A1 | 5/2002 | Mankins et al. |
| 2002/0084891 | A1 | 7/2002 | Mankins et al. |
| 2002/0101553 | A1 | 8/2002 | Enomoto et al. |
| 2002/0112026 | A1 | 8/2002 | Fridman et al. |
| 2002/0126248 | A1 | 9/2002 | Yoshida |
| 2002/0154138 | A1 | 10/2002 | Wada et al. |
| 2002/0164962 | A1 | 11/2002 | Mankins et al. |
| 2002/0167637 | A1 | 11/2002 | Burke et al. |
| 2002/0190972 | A1 | 12/2002 | Ven de Van |
| 2003/0007109 | A1 | 1/2003 | Park |
| 2003/0088832 | A1 | 5/2003 | Agostinelli et al. |
| 2003/0122810 | A1 | 7/2003 | Tsirkel et al. |
| 2003/0204342 | A1 | 10/2003 | Law et al. |
| 2003/0214242 | A1 | 11/2003 | Berg-johansen |
| 2003/0230991 | A1 | 12/2003 | Muthu et al. |
| 2004/0032382 | A1 | 2/2004 | Cok et al. |
| 2004/0036622 | A1 | 2/2004 | Dukach et al. |
| 2004/0036697 | A1 | 2/2004 | Kim et al. |
| 2004/0036834 | A1 | 2/2004 | Ohnishi et al. |
| 2004/0113044 | A1 | 6/2004 | Ishiguchi |
| 2004/0165139 | A1 | 8/2004 | Anderson et al. |
| 2004/0201547 | A1 | 10/2004 | Takayama |

(56) References Cited

U.S. PATENT DOCUMENTS

| | | |
|---|---|---|
| 2004/0243940 A1 | 12/2004 | Lee et al. |
| 2005/0012734 A1 | 1/2005 | Johnson et al. |
| 2005/0024538 A1 | 2/2005 | Park et al. |
| 2005/0043907 A1 | 2/2005 | Eckel et al. |
| 2005/0049729 A1 | 3/2005 | Culbert et al. |
| 2005/0073518 A1 | 4/2005 | Bontempi |
| 2005/0094391 A1 | 5/2005 | Campbell et al. |
| 2005/0127796 A1 | 6/2005 | Olesen et al. |
| 2005/0140640 A1 | 6/2005 | Oh et al. |
| 2005/0184983 A1 | 8/2005 | Brabander et al. |
| 2005/0231457 A1 | 10/2005 | Yamamoto et al. |
| 2005/0242741 A1 | 11/2005 | Shiota et al. |
| 2006/0007107 A1 | 1/2006 | Ferguson |
| 2006/0022616 A1 | 2/2006 | Furukawa et al. |
| 2006/0038511 A1 | 2/2006 | Tagawa |
| 2006/0049533 A1 | 3/2006 | Kamoshita |
| 2006/0087521 A1 | 4/2006 | Chu et al. |
| 2006/0125773 A1 | 6/2006 | Ichikawa et al. |
| 2006/0130501 A1 | 6/2006 | Singh et al. |
| 2006/0197474 A1 | 9/2006 | Olsen |
| 2006/0197735 A1 | 9/2006 | Vuong et al. |
| 2006/0214904 A1 | 9/2006 | Kimura et al. |
| 2006/0215044 A1 | 9/2006 | Masuda et al. |
| 2006/0220571 A1 | 10/2006 | Howell et al. |
| 2006/0238531 A1 | 10/2006 | Wang |
| 2006/0244702 A1 | 11/2006 | Yamazaki et al. |
| 2007/0013828 A1 | 1/2007 | Cho et al. |
| 2007/0047808 A1 | 3/2007 | Choe et al. |
| 2007/0152949 A1 | 7/2007 | Sakai |
| 2007/0171647 A1 | 7/2007 | Artwohl et al. |
| 2007/0173297 A1 | 7/2007 | Cho et al. |
| 2007/0200513 A1 | 8/2007 | Ha et al. |
| 2007/0222730 A1 | 9/2007 | Kao et al. |
| 2007/0230167 A1 | 10/2007 | McMahon et al. |
| 2007/0242153 A1 | 10/2007 | Tang et al. |
| 2007/0247594 A1 | 10/2007 | Tanaka |
| 2007/0268234 A1 | 11/2007 | Wakabayashi et al. |
| 2007/0268241 A1 | 11/2007 | Nitta et al. |
| 2007/0273624 A1 | 11/2007 | Geelen |
| 2007/0279369 A1 | 12/2007 | Yao et al. |
| 2007/0291198 A1 | 12/2007 | Shen |
| 2007/0297163 A1 | 12/2007 | Kim et al. |
| 2007/0297172 A1 | 12/2007 | Furukawa et al. |
| 2008/0019147 A1 | 1/2008 | Erchak et al. |
| 2008/0055297 A1 | 3/2008 | Park |
| 2008/0074382 A1 | 3/2008 | Lee et al. |
| 2008/0078921 A1 | 4/2008 | Yang et al. |
| 2008/0084166 A1 | 4/2008 | Tsai |
| 2008/0111958 A1 | 5/2008 | Kleverman et al. |
| 2008/0136770 A1 | 6/2008 | Peker et al. |
| 2008/0143187 A1 | 6/2008 | Hoekstra et al. |
| 2008/0151082 A1 | 6/2008 | Chan |
| 2008/0165203 A1 | 7/2008 | Pantfoerder |
| 2008/0170031 A1 | 7/2008 | Kuo |
| 2008/0176345 A1 | 7/2008 | Yu et al. |
| 2008/0185976 A1 | 8/2008 | Dickey et al. |
| 2008/0204375 A1 | 8/2008 | Shin et al. |
| 2008/0218501 A1 | 9/2008 | Diamond |
| 2008/0224892 A1 | 9/2008 | Bogolea et al. |
| 2008/0246871 A1 | 10/2008 | Kupper et al. |
| 2008/0266554 A1 | 10/2008 | Sekine et al. |
| 2008/0278099 A1 | 11/2008 | Bergfors et al. |
| 2008/0278100 A1 | 11/2008 | Hwang |
| 2008/0303918 A1 | 12/2008 | Keithley |
| 2009/0009997 A1 | 1/2009 | Sanfilippo et al. |
| 2009/0033612 A1 | 2/2009 | Roberts et al. |
| 2009/0079416 A1 | 3/2009 | Vinden et al. |
| 2009/0085859 A1 | 4/2009 | Song |
| 2009/0091634 A1 | 4/2009 | Kennedy et al. |
| 2009/0104989 A1 | 4/2009 | Williams et al. |
| 2009/0109129 A1 | 4/2009 | Cheong et al. |
| 2009/0135167 A1 | 5/2009 | Sakai et al. |
| 2009/0152445 A1 | 6/2009 | Gardner, Jr. |
| 2009/0278766 A1 | 11/2009 | Sako et al. |
| 2009/0284457 A1 | 11/2009 | Botzas et al. |
| 2009/0289968 A1 | 11/2009 | Yoshida |
| 2010/0033413 A1 | 2/2010 | Song et al. |
| 2010/0039366 A1 | 2/2010 | Hardy |
| 2010/0039414 A1 | 2/2010 | Bell |
| 2010/0039440 A1 | 2/2010 | Tanaka et al. |
| 2010/0060861 A1 | 3/2010 | Medin |
| 2010/0066484 A1* | 3/2010 | Hanwright ........ H04L 12/40013 340/3.44 |
| 2010/0177750 A1 | 7/2010 | Essinger et al. |
| 2010/0194725 A1 | 8/2010 | Yoshida et al. |
| 2010/0231602 A1 | 9/2010 | Huang |
| 2010/0237697 A1* | 9/2010 | Dunn .................... G06F 1/3265 307/31 |
| 2010/0253660 A1 | 10/2010 | Hashimoto |
| 2011/0032285 A1 | 2/2011 | Yao et al. |
| 2011/0032489 A1 | 2/2011 | Kimoto et al. |
| 2011/0050738 A1 | 3/2011 | Fujioka et al. |
| 2011/0058326 A1 | 3/2011 | Idems et al. |
| 2011/0074737 A1 | 3/2011 | Hsieh et al. |
| 2011/0074803 A1 | 3/2011 | Kerofsky |
| 2011/0102630 A1 | 5/2011 | Rukes |
| 2011/0148904 A1 | 6/2011 | Kotani |
| 2011/0163691 A1 | 7/2011 | Dunn |
| 2011/0175872 A1 | 7/2011 | Chuang et al. |
| 2011/0193872 A1 | 8/2011 | Biernath et al. |
| 2011/0231676 A1 | 9/2011 | Atkins et al. |
| 2011/0260534 A1 | 10/2011 | Rozman et al. |
| 2011/0279426 A1 | 11/2011 | Imamura et al. |
| 2011/0283199 A1 | 11/2011 | Schuch et al. |
| 2012/0075362 A1 | 3/2012 | Ichioka et al. |
| 2012/0081279 A1 | 4/2012 | Greenebaum et al. |
| 2012/0176420 A1 | 7/2012 | Liu |
| 2012/0182278 A1 | 7/2012 | Ballestad |
| 2012/0212520 A1 | 8/2012 | Matsui et al. |
| 2012/0268436 A1 | 10/2012 | Chang |
| 2012/0269382 A1 | 10/2012 | Kiyohara et al. |
| 2012/0284547 A1 | 11/2012 | Culbert et al. |
| 2013/0027370 A1 | 1/2013 | Dunn et al. |
| 2013/0070567 A1 | 3/2013 | Marzouq |
| 2013/0098425 A1 | 4/2013 | Amin et al. |
| 2013/0113973 A1 | 5/2013 | Miao |
| 2013/0158730 A1 | 6/2013 | Yasuda et al. |
| 2013/0278868 A1 | 10/2013 | Dunn et al. |
| 2013/0344794 A1 | 12/2013 | Shaw et al. |
| 2014/0002747 A1 | 1/2014 | Macholz |
| 2014/0132796 A1 | 5/2014 | Prentice et al. |
| 2014/0139116 A1 | 5/2014 | Reed |
| 2014/0190240 A1 | 7/2014 | He et al. |
| 2014/0204452 A1 | 7/2014 | Branson |
| 2014/0232709 A1 | 8/2014 | Dunn et al. |
| 2014/0293605 A1 | 10/2014 | Chemel et al. |
| 2014/0365965 A1 | 12/2014 | Bray et al. |
| 2015/0062892 A1 | 3/2015 | Krames et al. |
| 2015/0070337 A1 | 3/2015 | Bell et al. |
| 2015/0310313 A1 | 10/2015 | Murayama et al. |
| 2015/0346525 A1 | 12/2015 | Wolf et al. |
| 2015/0348460 A1 | 12/2015 | Cox et al. |
| 2016/0037606 A1 | 4/2016 | Dunn et al. |
| 2016/0162297 A1 | 6/2016 | Shao |
| 2016/0198545 A1 | 7/2016 | Dunn et al. |
| 2016/0334811 A1 | 11/2016 | Marten |
| 2016/0335698 A1 | 11/2016 | Jones et al. |
| 2016/0338181 A1 | 11/2016 | Schuch et al. |
| 2016/0338182 A1 | 11/2016 | Schuch et al. |
| 2016/0358530 A1 | 12/2016 | Schuch et al. |
| 2016/0358538 A1 | 12/2016 | Schuch et al. |
| 2017/0111486 A1 | 4/2017 | Bowers et al. |
| 2017/0111520 A1 | 4/2017 | Bowers et al. |
| 2017/0168295 A1 | 6/2017 | Iwami |
| 2018/0012565 A1 | 1/2018 | Dunn |
| 2018/0040297 A1 | 2/2018 | Dunn et al. |
| 2018/0042134 A1 | 2/2018 | Dunn et al. |
| 2018/0132327 A1 | 5/2018 | Dunn et al. |
| 2018/0206316 A1 | 7/2018 | Schuch et al. |
| 2019/0237045 A1 | 8/2019 | Dunn et al. |

(56) References Cited

U.S. PATENT DOCUMENTS

| | | |
|---|---|---|
| 2019/0339312 A1 | 11/2019 | Dunn et al. |
| 2019/0383778 A1 | 12/2019 | Dunn et al. |

FOREIGN PATENT DOCUMENTS

| | | |
|---|---|---|
| AU | 2016262614 B2 | 1/2019 |
| CA | 2754371 C | 11/2017 |
| CA | 2849902 C | 2/2019 |
| EP | 1686777 A1 | 8/2006 |
| EP | 2299723 A1 | 3/2011 |
| EP | 2401738 A2 | 1/2012 |
| EP | 2769376 A1 | 8/2014 |
| EP | 2577389 B1 | 5/2017 |
| EP | 3295452 A1 | 3/2018 |
| EP | 2401738 B1 | 5/2018 |
| EP | 3338273 A1 | 6/2018 |
| GB | 2369730 A | 5/2002 |
| JP | 3-153212 A | 7/1991 |
| JP | 5-18767 A | 1/1993 |
| JP | 8193727 A | 7/1996 |
| JP | 8-338981 A | 12/1996 |
| JP | 11-160727 A | 6/1999 |
| JP | 2000122575 A | 4/2000 |
| JP | 2004325629 A | 11/2004 |
| JP | 2005-148490 A | 6/2005 |
| JP | 2005265922 A | 9/2005 |
| JP | 2005-338266 A | 12/2005 |
| JP | 2006-106345 A | 4/2006 |
| JP | 2006-145890 A | 6/2006 |
| JP | 2006318733 A | 11/2006 |
| JP | 2007003638 A | 1/2007 |
| JP | 2007322718 A | 12/2007 |
| JP | 2008-34841 A | 2/2008 |
| JP | 2008-83290 A | 4/2008 |
| JP | 2008122695 A | 5/2008 |
| JP | 2009031622 A | 2/2009 |
| JP | 2010-181487 A | 8/2010 |
| JP | 2010-282109 A | 12/2010 |
| JP | 2011-59543 A | 3/2011 |
| JP | 2018-523148 A | 8/2018 |
| JP | 2018-525650 A | 9/2018 |
| KR | 0313331 B1 | 2/1994 |
| KR | 10-2006-0016469 A | 2/2006 |
| KR | 10-0768584 B1 | 10/2007 |
| KR | 10-2008-0000144 A | 1/2008 |
| KR | 10-2008-0013592 A | 2/2008 |
| KR | 10-2008-0086245 A | 9/2008 |
| KR | 10-2009-0014903 A | 2/2009 |
| KR | 10-2010-0019246 A | 2/2010 |
| KR | 10-2011-0125249 A | 11/2011 |
| KR | 10-2014-0054747 A | 5/2014 |
| KR | 10-1759265 B1 | 7/2017 |
| KR | 10-1931733 B1 | 12/2018 |
| KR | 10-2047433 B1 | 11/2019 |
| WO | 2008/050402 A1 | 5/2008 |
| WO | 2010/141739 A2 | 12/2010 |
| WO | 2011/052331 A1 | 5/2011 |
| WO | 2011/130461 A2 | 10/2011 |
| WO | 2011/150078 A2 | 12/2011 |
| WO | 2013/044245 A1 | 3/2013 |
| WO | 2016/183576 A1 | 11/2016 |
| WO | 2017/031237 A1 | 2/2017 |
| WO | 2017/210317 A1 | 12/2017 |
| WO | 2018/009917 A1 | 1/2018 |
| WO | 2019/241546 A1 | 12/2019 |

OTHER PUBLICATIONS

Vogler, A. et al., Photochemistry and Beer, Journal of Chemical Education, Jan. 1982, pp. 25-27, vol. 59, No. 1.
Zeeff, T.M. et al., Abstract of EMC analysis of 18" LCD Monitor, Electromagnetic Compatibility, IEEE International Symposium, Aug. 21-25, 2000, vol. 1, 1 page.
Lee, X., What is Gamma Correction in Images and Videos?, http://xahlee.info/img/what_is_gamma_correction.html, Feb. 24, 2010, 4 pages.
Hoober, S. et al., Designing Mobile Interfaces, 2012, pp. 519-521, O'Reilly Media.
Outdoorlink, Inc., SmartLink Website User Manual, http://smartlink.outdoorlinkinc.com/docs/SmartLinkWebsiteUserManual.pdf, 2017, 33 pages.
Outdoorlink, Inc., SmartLink One, One Relay, http://smartlinkcontrol.com/billboard/one-relay/, retrieved Apr. 17, 2019, 2007-16, 6 pages.
Outdoorlink, Inc., SmartLink One Out of Home Media Controller, 2016, 1 page.

* cited by examiner

MEASURING POWER CONSUMPTION OF AN ELECTRONIC DISPLAY ASSEMBLY

CROSS-REFERENCE TO RELATED APPLICATION

This application is a divisional of U.S. non-provisional application Ser. No. 15/972,904 filed May 7, 2018, the disclosure of which is hereby incorporated by reference as if fully restated.

TECHNICAL FIELD

Exemplary embodiments of the present invention relate generally to systems and methods for measuring power consumption of electronic display assemblies.

BACKGROUND AND SUMMARY OF THE INVENTION

Electric meters have long been a staple of the home. These meters are typically located on or near the side of the house where the electric line connecting the home to the electrical grid enters the home. The electric meter is interposed at the entry into the home to determine the amount of power consumed by the home so that the owner may be billed based upon the actual usage. The same is generally true of other types of buildings (e.g., commercial).

Electronic displays are increasingly being used in both indoor and outdoor applications. Such electronic displays are sometimes placed in assemblies with a ruggedized housing in order to fit the intended application of the electronic display. Such applications include, but are not limited to, placement on city sidewalks, the sides of buildings, bus shelters, the tops of vehicles, billboards, entrances, stadiums, malls, airports, public transportation areas, and the like. Consumers have increasingly begun demanding larger, brighter, clearer displays, and the like. Consumers have also increasingly begun demanding more features associated with the electronic displays. Examples of such associated features include, but are not limited to, video conferencing, telephonic systems, internet connectivity, cameras, sensors, wayfinding, and the like. The result of these larger displays and added features is greater power consumption by the assembly.

In many cases, one party owns the assembly itself or the physical real estate (e.g., bus stop, sidewalk, building, entrance, signage, or the like) where the assembly is located. In many cases, this owning party is responsible for payment of the assembly's power consumption. However, in some cases it would be desirable to charge another party for the power consumption of the assembly—such as the party showing images on the display. For example, without limitation, in some cases, a city is responsible for the power consumption of such assemblies located on its sidewalks. However, it would be desirable to charge the owner of the assemblies for their power consumption. As another example, without limitation, in some cases, one party owns the display but rents out advertising time on the display to third parties. In such cases, it may be desirable to charge the particular advertiser for power consumed by the assembly while the third party's advertisement is being shown on the assembly.

In such cases, the party responsible for the assembly's power consumption might be forced to interject a power meter on or near the assembly to measure its power consumption. However, this is costly, labor intensive, unaesthetic, and takes up valuable real estate. Therefore, what is needed is an assembly for an electronic display having a simulated electric meter.

The present invention is an assembly for an electronic display having a simulated electric meter. The assembly may comprise a housing for one or more electronic display subassemblies. Each electronic display subassembly may comprise an illumination device, a display layer, and a cover. In exemplary embodiments, a closed loop of air may pass between the display layer and the cover of each subassembly and into a compartment located between the subassemblies. An open loop of ambient air may pass through each subassembly and may pass along the rear surface of the illumination device located therein. A number of electronic components for operating the assembly may be located in the compartment. The simulated electric meter may be in electrical connection with a utility electric supply and all of the electricity consuming components of the assembly such that all electricity consumed by the assembly may pass through the simulated electric meter.

The simulated electric meter may comprise a processor, an electronic storage device, a timing device, a current sensor, and a voltage sensor. The electronic storage device may comprise software instructions, which when executed, cause the processor to take measurements from the sensors. In exemplary embodiments, the sensors may determine the current and the voltage of the incoming electricity, which may be multiplied together to determine the power being consumed. In other exemplary embodiments, the voltage may already be known and multiplied with the current reading to determine power consumption. Such readings and power consumption calculations may be repeated over a period of time at a given frequency. The elapsed time may be measured by the timing device. After a predetermined amount of time has passed, the power measurements may be summed and divided by the total number of readings to determine an average consumption measure for the given period of time.

The simulated electric meter may be in electronic communication with a remote electronic device to monitor power consumption as well as review past power consumption and predict future power consumption. Additionally, the simulated electric meter may be in communication with the video player or a proof of play device in order to track what images are shown on the electronic display subassemblies of the assembly when the power is consumed.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Figure 1:
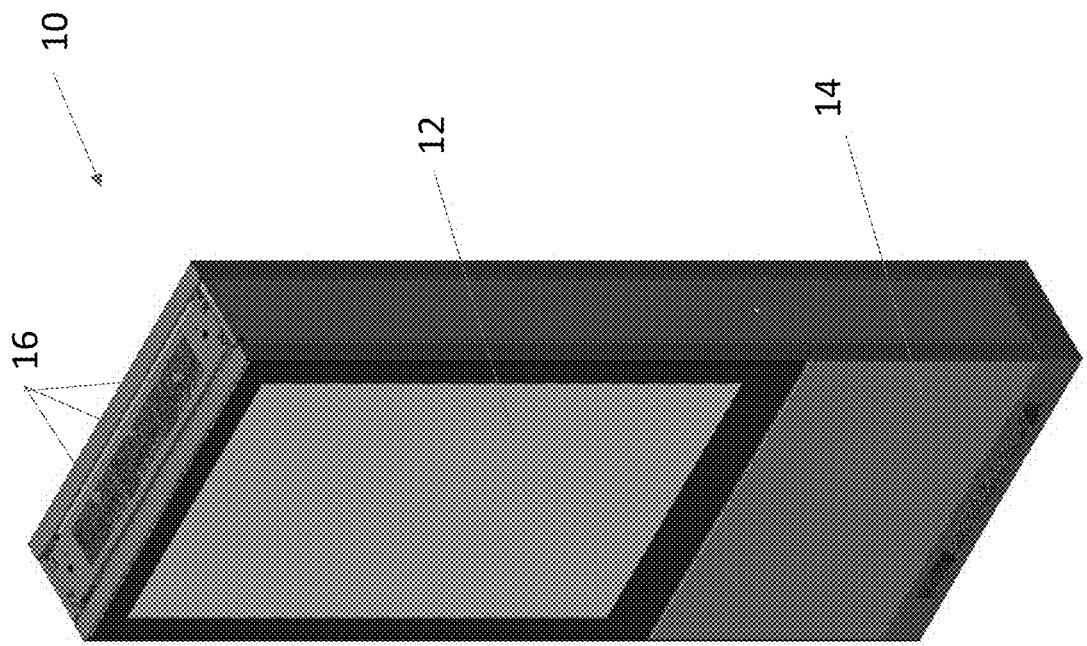
FIG. 1 is a perspective view of an exemplary assembly for an electronic display comprising a simulated electric meter.

FIG. 1 is a perspective view of an exemplary assembly 10 for an electronic display comprising a simulated electric meter 44. The assembly 10 may comprise one or more electronic display subassemblies 12 located on a housing 14. In exemplary embodiments, a first and second electronic display subassembly 12 may be mounted to the housing 14 in a hinged fashion such that the electronic display subassemblies 12 are capable of being rotated between a closed position, wherein the electronic display subassembly 12 is in contact with the housing 14, and an opened position wherein the electronic display subassembly 12 is located away from the housing 14. One or more openings 16 may be located on or around the housing 14 such that ambient air 28 may be ingested into, or exhausted from, the assembly 10. The housing 14 may be configured to permit the assembly 10 to be mounted to a sidewalk, the ground, a building, a bus shelter, a vehicle, a wall, a billboard, in a window, in a storefront, or the like.

Figure 2:
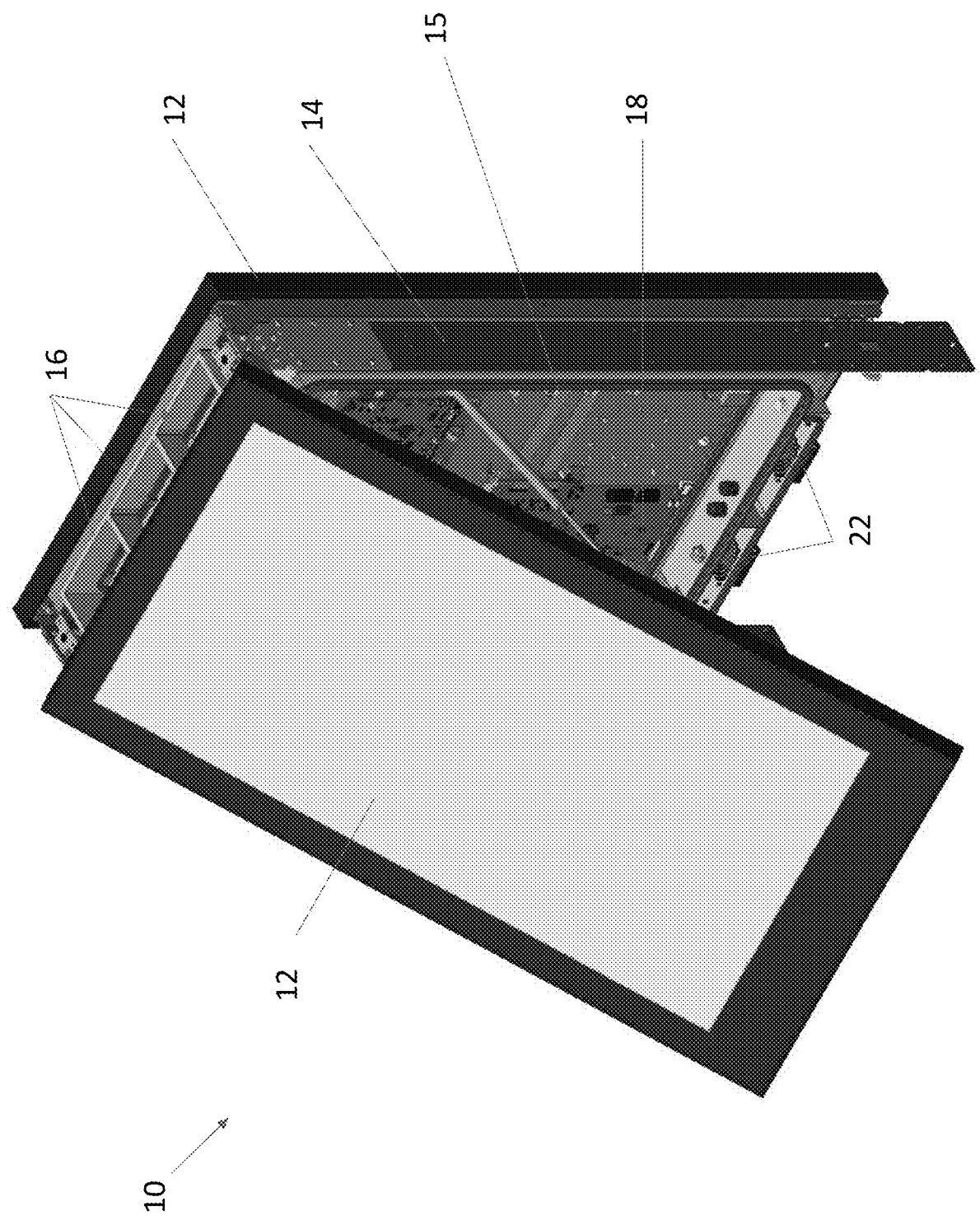
FIG. 2 is a perspective view of the assembly of FIG. 1 with some components removed and one of the electronic display subassemblies in an open position so as to illustrate additional components of the assembly.

FIG. 2 is a perspective view of the assembly of FIG. 1 with some components removed and one of the electronic display subassemblies 12 in an open position so as to illustrate additional components of the assembly 10. In exemplary embodiments, the rear surfaces of the two electronic display subassemblies 12 and the housing 14 may define a compartment 15 located therebetween. The compartment 15 may be substantially sealed. Gaskets may extend along the perimeter of the housing 14 where the display subassemblies 12 meet the housing to provide such a seal. Various electronic components 18 may be mounted between or to one or more of the electronic display subassemblies 12 or to structures located within the compartment 15. Such electronic component 18 may be used to operate the assembly 10 and include, but are not limited to, video players, processors, electronic storage devices, camera, sensors, power sources, power modules, network connectivity devices, some combination thereof, or the like. Fans 22 may be located at various positions on the housing 14 or within the compartment 15 formed between the electronic display subassemblies 12.

Figure 3:
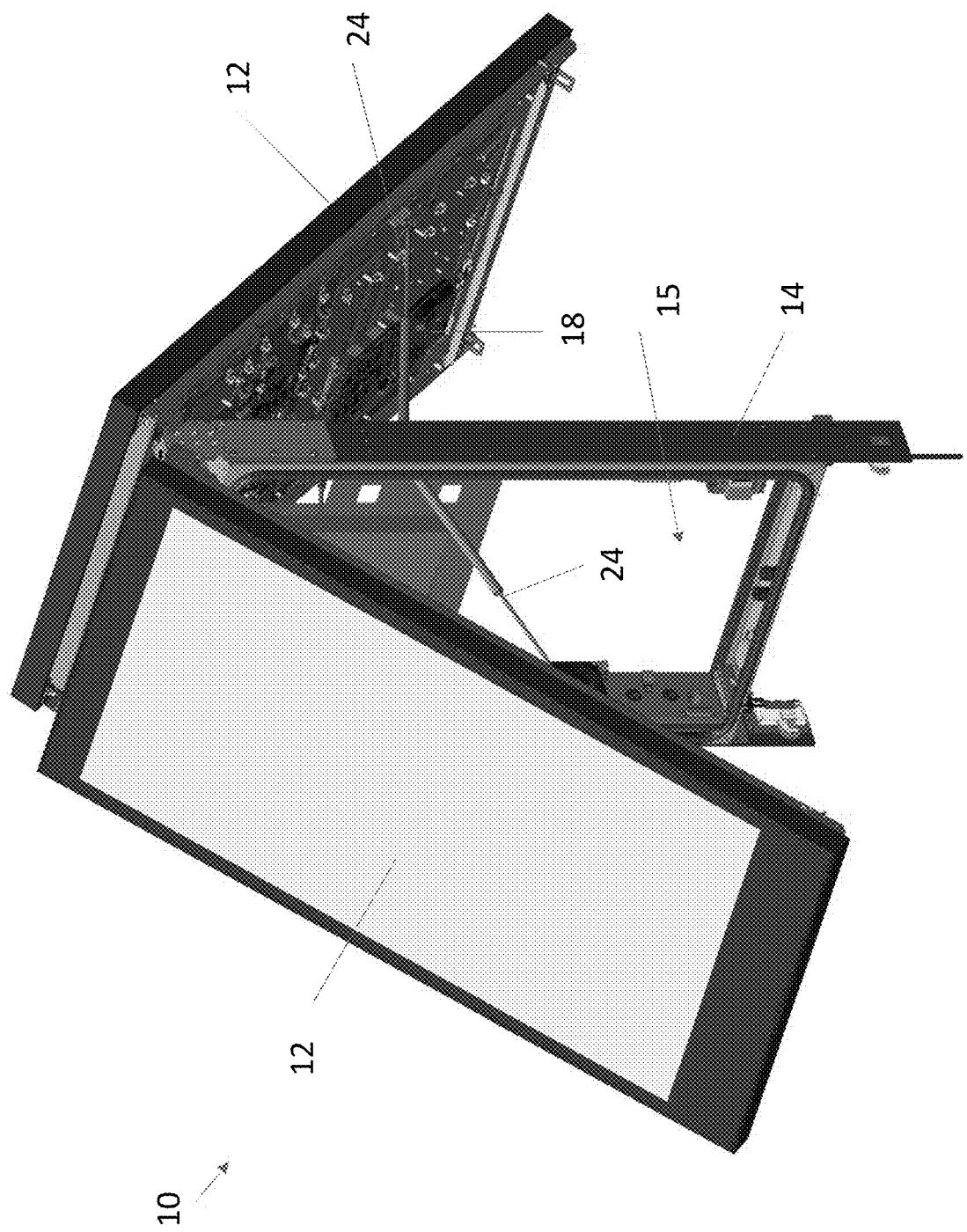
FIG. 3 is a perspective view of the assembly of FIG. 2 with a second electronic display subassembly in an open position so as to illustrate additional components of the assembly.

FIG. 3 is a perspective view of the assembly of FIG. 2 with one of the electronic display subassemblies 12 located in an open position so as to illustrate additional components of the assembly 10. Assist devices 24 may extend between the housing 14 and the electronic display subassemblies 12 to assist in moving the electronic display subassemblies 12 between the opened and closed positions. These assist devices 24 may also assist in securing the electronic display subassemblies 12 in the opened or closed positions. The assist devices 24 may be gas springs, gas struts, pullies, levels, ratcheting devices, struts, members, springs, counter weights, cams, some combination thereof, or the like.

Figure 4:
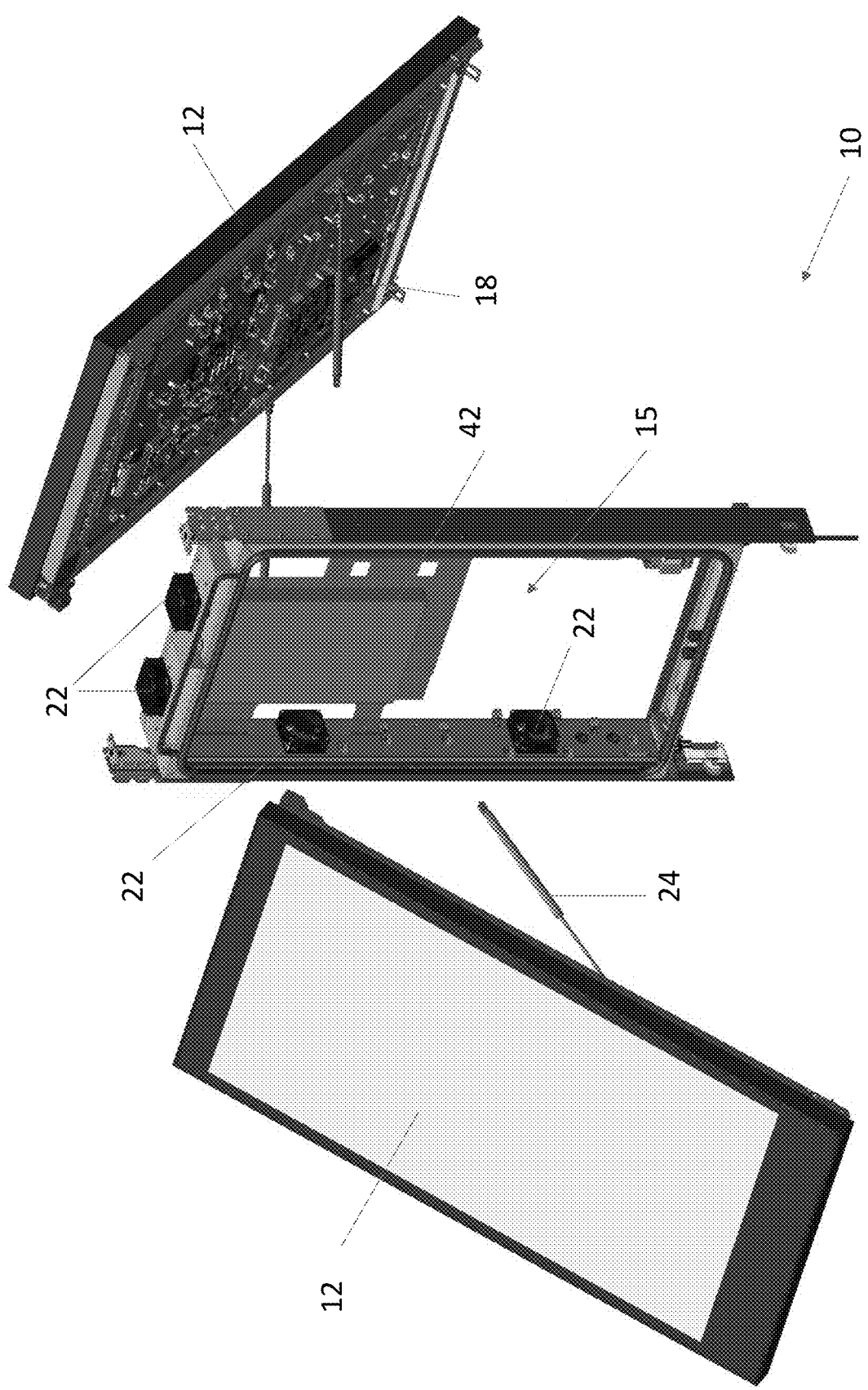
FIG. 4 is an exploded view of the assembly of FIG. 3.

FIG. 4 is an exploded view of the assembly of FIG. 3. Additional fans 22 may be located at various positions on the housing 14 or in the compartment 15. Additional equipment 42 may be located within the compartment 15. The additional equipment 42 may be various electronic and other components which facilitate the inclusion of additional features such as, but not limited to, video conferencing, telephonic systems, internet connectivity devices, cameras, and the like. For example, without limitation, the additional equipment 42 may comprise video players, processors, electronic storage devices, cameras, microphones, sensors, power sources, wayfinding equipment, power modules, network connectivity devices, some combination thereof, or the like.

Figure 6:
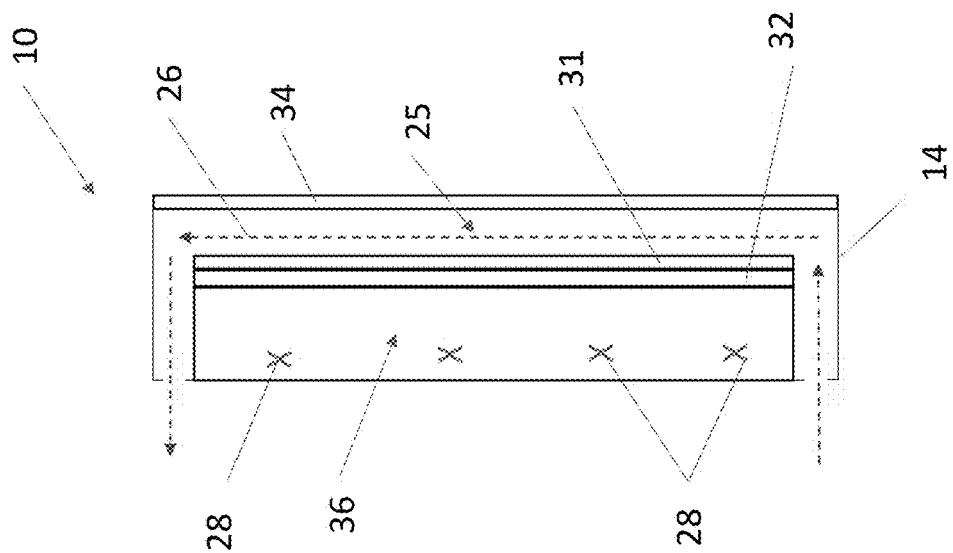
FIG. 6 is a top sectional view of one of the subassembly of FIG. 5.
Figure 5:
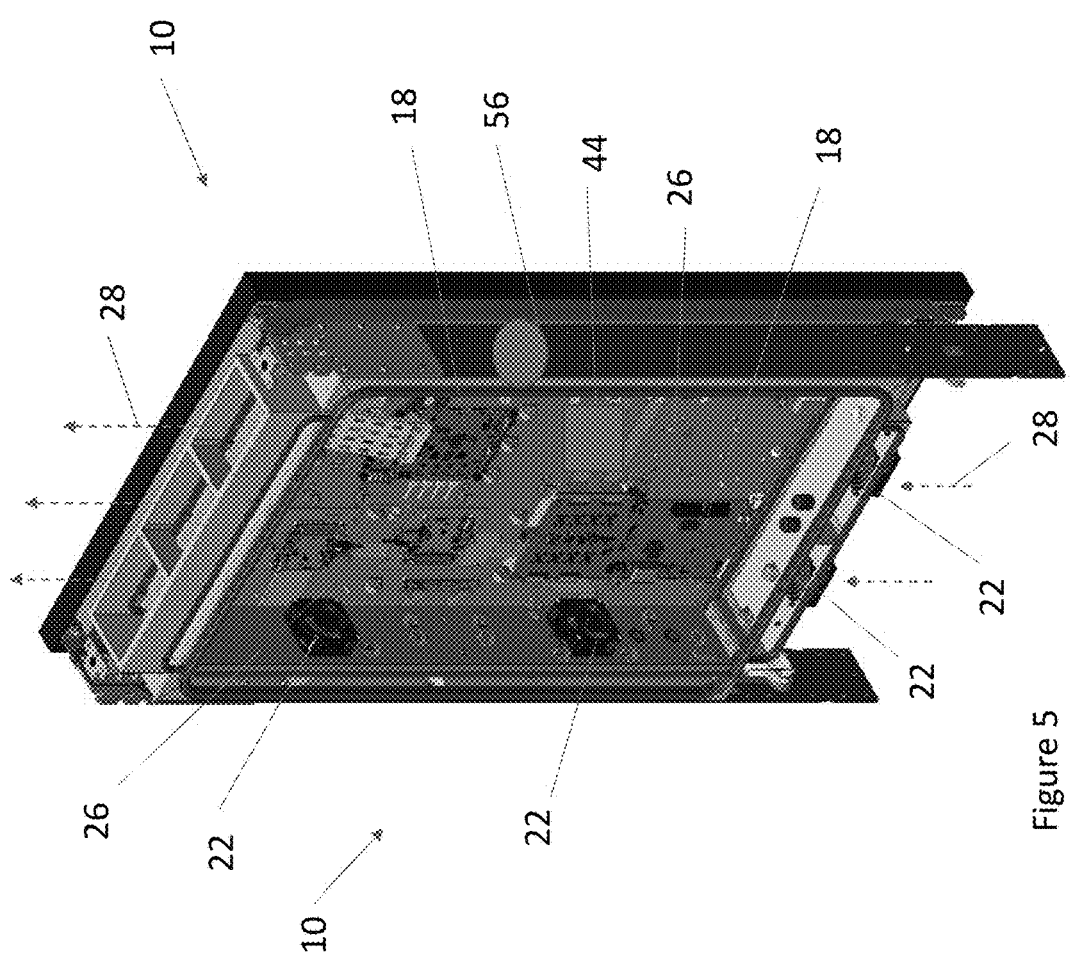
FIG. 5 is a perspective view of the assembly of FIG. 2 with one of the electronic display subassemblies removed so as to illustrate additional components of the assembly.

FIG. 5 is a perspective view of the assembly of FIG. 2 with one of the electronic display assemblies 12 removed so as to illustrate additional components of the assembly 10. FIG. 6 is a top sectional view of the assembly of FIG. 5. In particular, FIG. 5 and FIG. 6 illustrate an exemplary flow of ambient air 28 and circulating air 26 through the assembly 10. Ambient air 28 may enter from the ambient environment through the intake opening 16 and may pass through a gap 36 in one or more of the electronic display subassemblies 12. In exemplary embodiments, the gap 26 may be located such that ambient air 28 passes behind an illumination device 32 for an electronic display layer 31, though any located is contemplated. The illumination device 32 may be a backlight. In other exemplary embodiments, the ambient air 28 may instead pass through the compartment 15.

The electronic display layer 31 may be a liquid crystal display ("LCD"), Light Emitting Diode ("LED"), Organic LED ("OLED"), type display or the like. The illumination device 32 may comprise one or more incandescent light bulbs, LEDs, OLEDs, or the like. In exemplary embodiments, the illumination device 32 multiple light bulbs, LEDs, OLEDs, or the like, which may be arranged in an array on a sheet behind the electronic display layer 31 in a direct-lit arrangement, or adjacent thereto in an edge-lit arrangement, such as but not limited to, along the edge of a light guide located behind the display layer 31. In exemplary embodiments, a cover 34 may be located in front of the display layer 31. The cover 34 may be a transparent sheet, such as but not limited to, a cover glass.

In some exemplary embodiments, the electronic display layer 31 may transparent or translucent. The housing 14 may be configured to locate the electronic display layer 31 over a compartment, such as but not limited to, a cooler, vending machine, display case, or the like.

Ambient air 28 may exit the assembly 10 though the opening 16 where it is returned to the ambient environment. This pathway for the ambient air 28 may define an open loop. The ambient air 28 may be moved by one or more fans 22 placed along or near the open loop. One or more filtration devices may likewise be placed along the open loop. While the ambient air 28 is illustrated as traveling vertically from bottom to top, it is contemplated that the ambient air 28 may also travel vertically from top to bottom. Alternatively, or in addition, the ambient air 28 may travel horizontally.

Circulating air 26 may travel from the compartment 15 through one or more of the electronic display subassemblies 12. In exemplary embodiments, the circulating air 26 may travel through a channel 25 located between the cover 34 and the display layer 31. A similar pathway may be taken with a second flow of circulating air 26 within the second electronic display subassembly 12. Regardless, the circulating air 26 may be returned to the compartment 15. This pathway of the circulating air 26 may define a closed loop. The circulating air 26 may be moved by one or more fans 22 placed along the closed loop. While the circulating air 26 is illustrated as traveling horizontally, it is contemplated that alternatively, or in addition, the circulating air 26 may travel vertically. In exemplary embodiments, the open loop and the closed loop may be configured to substantially prevent the ambient air 28 and the circulating air 26 from mixing. In particular, the closed loop may be substantially sealed to prevent particulate in the ambient air 28 from mixing with the circulating air 26.

The illustrated open loop and closed loops are merely exemplary and are not intended to be limiting. Any pathway for ambient air 28 is contemplated. Likewise, any pathway for circulating gas 26 is contemplated. It is contemplated that in some embodiment, the closed loop and circulating gas 26 may not be required. In still other exemplary embodiments, the circulating gas 26 and closed loop may be limited to traveling within the compartment 15. It is similarly contemplated that in some embodiment, the open loop and ambient air 28 may not be required. Heat may be removed by the use of thermoelectric devices, air conditioning, fins, heat sinks, thermal plates, or the like.

As will be described in greater detail herein, the assembly 10 may additionally comprise a simulated electric meter 44. The simulated electric meter 44 may be located in the compartment 15 or on the housing 14, though any location on the assembly 10 is contemplated. The simulated electric meter 44 may be electrically connected to the electrical supply for the assembly 10.

In exemplary embodiments, the simulated electric meter 44 is located on, or in close proximity with, a connector 56. The connector 56 may be located on the housing 14 or other portion of the assembly 10 or the electrical display subassembly 12. In exemplary embodiments, the connector 56 is a pass-through device configured to permit one or more wires to pass through the housing 14 and into the assembly 10 while maintaining a substantially air-tight seal. The connector 56 may be configured to place the assembly 10 in electrical connection with a utility electric supply 54 by way or one or more utility electrical supply lines. The utility electric supply 54 may be an electrical grid, battery, generator, power plant, or the like. In exemplary embodiments, the connector 56 may serve as a connection point for the utility electrical supply line on one end and the simulated electric meter 44 (and thus the electricity consuming components of the assembly 10) on the other end. Any kind of connector 56 is contemplated including, but not limited to, an outlet, port, sealed passage, or the like. In exemplary embodiments, the connector 56 provides a substantially air tight seal so that the compartment 15 remains substantially sealed.

Figure 7:
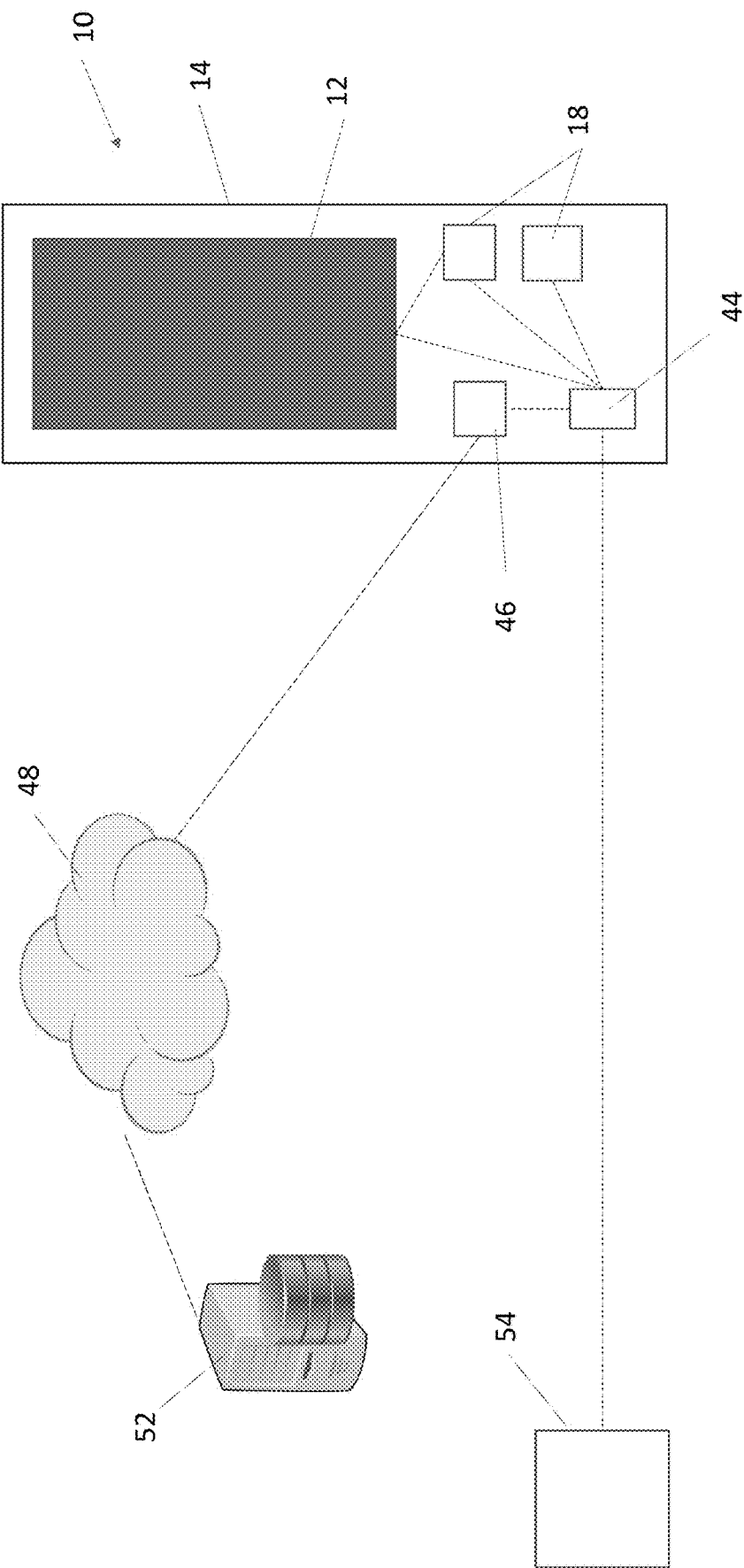
FIG. 7 is a simplified diagram illustrating an exemplary system utilizing the assembly of FIG. 1.

FIG. 7 is a simplified diagram illustrating an exemplary system utilizing the assembly 10. The simulated electric meter 44 may be in electrical connection with all of the electricity consuming components of the assembly 10, including but not limited to, the electronic components 18, the illumination device 32, the additional equipment 42, and a network connectivity device 46. In this way, the simulated electric meter 44 may be positioned to encounter all of the electricity flowing into the assembly 10.

Figure 8:
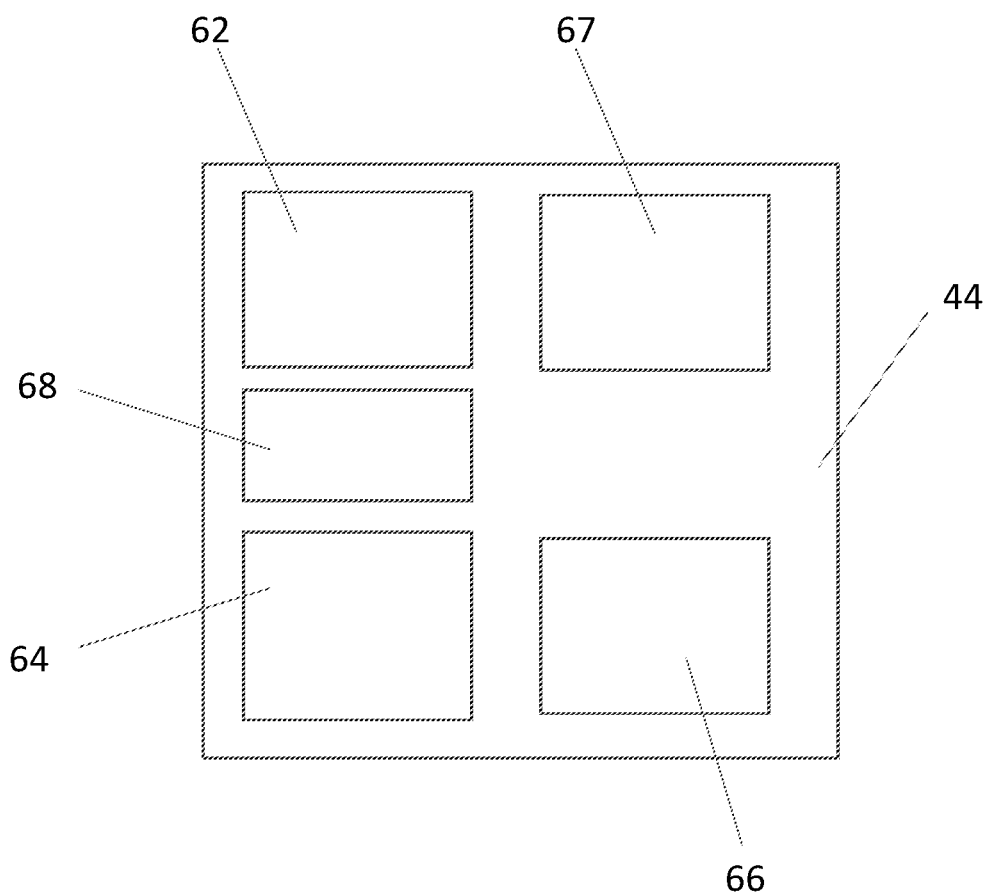
FIG. 8 is a detailed view of the simulated electric meter of FIG. 7.

FIG. 8 is a detailed view of the simulated electric meter 44 of FIG. 7. The simulated electric meter 44 may comprise a processor 62, an electronic storage device 64, a timing device 66, a current sensor 68, and a voltage sensor 67. The simulated electric meter 44 may comprise other electrical components, including but not limited to, capacitors, resistors, relays, diodes, inductors, voltage sources, logic gates, microcontrollers, and the like. The current sensor 68 and the voltage sensor 67 may be in contact (direct or indirect) with the electrical wiring passing into or through the assembly 10. For example, without limitation, the simulated electric meter 44 may be located immediately adjacent to the connector 56, though any location is contemplated. While the current and voltage sensors, 68 and 67 respectively, are described as separate components herein, it is contemplated that a single sensor may be used to measure both current and voltage. Alternatively, or in addition, it is contemplated that the voltage may be a known, preprogramed value and only the current sensor 68 is required.

The current sensor 68 may be configured to detect the current of the electricity in contact therewith. Similarly, the voltage sensor 67 may be configured to detect the voltage of the electricity in contact therewith. The measured current and voltage values may be actual, approximate, peak, root mean square, average, median, mode values, or the like. Alternatively, or in addition, the voltage or current values may already be known and preprogrammed. For example, without limitation, the voltage of the supplied electricity may be known to be 120v or 220v.

Figure 9:
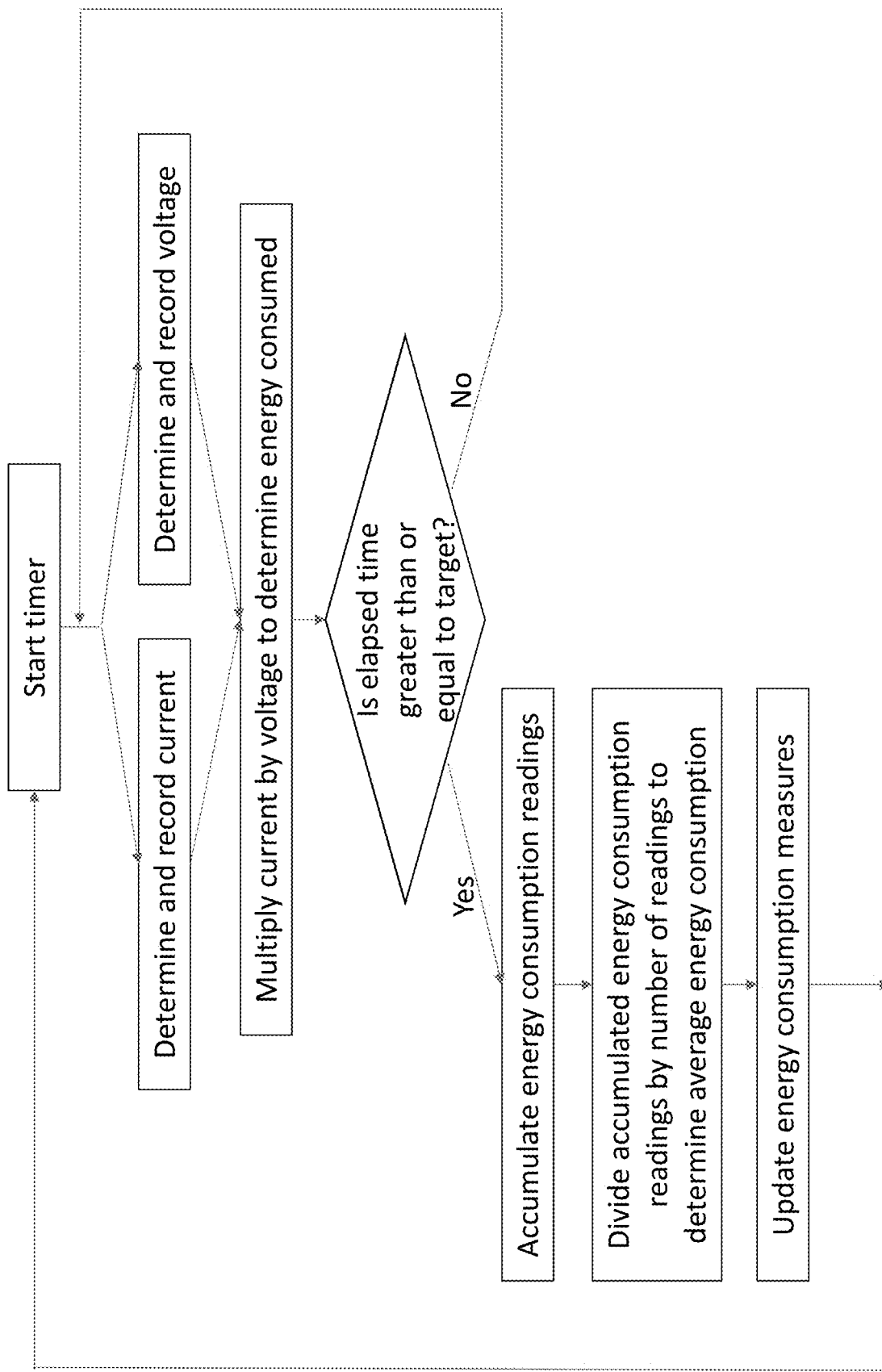
FIG. 9 is a flowchart of exemplary logic that may be used with the simulated electric meter.

As additionally shown in FIG. 9, the electronic storage device 64 may comprise software instructions, which when executed, cause the processor 62 to take one or more readings from the current sensor 68 and the voltage sensor 67 for the electricity in contact with the current sensor 68 and the voltage sensor 67—that is, the electricity passing through the simulated electric meter 44 to be consumed by the assembly 10. In exemplary embodiments, such readings may be taken approximately once per second, though any frequency of readings is contemplated. The processor 62 may be configured to multiply the measured current value with the measured voltage value to determine a power consumption reading. This value may be stored at the electronic storage device 64 or elsewhere.

The electronic storage device 64 may comprise software instructions, which when executed, cause the processor 62 to take readings from the timing device 66 to measure the current time or the elapsed time. In exemplary embodiments, the processor 62 may be configured to measure the elapsed time, by way of the timing device 66, from when a first current or voltage measurement is taken and continue monitoring the elapsed time each instance a current or voltage measurement is taken. Once the elapsed time is greater than or equal to a predetermined target time, the processor 62 may be configured to sum the power consumption readings taken during the time period in question and divide the summed total by the number of readings to determine an average power consumption reading for the time period. The processor 62 may be configured to update various power consumption measures as described in greater detail herein. This information can be used to, for example, determine the kilowatt-hours ("kW hours") consumed by the assembly 10. Alternatively, or in addition, the processor 62 may calculate the elapsed time by multiplying the inverse of the known frequency of measurements by the number of measurements taken.

In exemplary embodiments, at least the following power consumption measures are tracked and periodically updated: monthly power consumption (e.g., accumulated kW hours for the current calendar month); yearly power consumption (e.g., accumulated kW hours for the current calendar year); lifetime power consumption (e.g., accumulated kW hours from time 0 to infinity); last month power consumption (e.g., the accumulated kW hours for the last calendar month); last year power consumption (e.g., the accumulated kW hours for the last calendar year); average monthly power consumption (e.g., average of average hourly or daily power consumption for all hours or days in the previous month); average yearly power consumption (e.g., average of average hourly, daily, or monthly power consumption for all hours, days, or months in the previous month); and monthly averages for the last calendar year. These measurements are merely exemplary and are not intended to be limiting. Any number or type of measurements are contemplated. An exemplary report of power consumption is provided below.

The processor 62 may store these measurements and others from the simulated electric meter 44 in the electronic storage device 64 or elsewhere. The simulated electric meter 44 may be in electronic communication with the network connectivity device 46, which may be in electronic communication with a remote electronic device 52 by way of a network 48. The network 48 may be the internet, cellular network, intranet, or the like. The connection between the network connectivity device 46, the network 48, and the remote electronic device 52 and other components may be wired or wireless. The remote electronic device 52 may be a personal computer, smart phone, tablet or the like and may be configured to receive data from the simulated electric meter 44 and generate a report of power consumption.

The measurements taken from the simulated electric meter 44, such as but not limited to those stored on the electronic storage device 64, may be transmitted to the remote electronic device 52. The processor 62, or the remote electronic device 52, may be configured to track the measurements from the simulated electric meter 44 over a period of time. The processor 62 or the remote electronic device 52 may be further configured to generate a user interface illustrating the measurements from the simulated electric meter 44.

Figure 10:
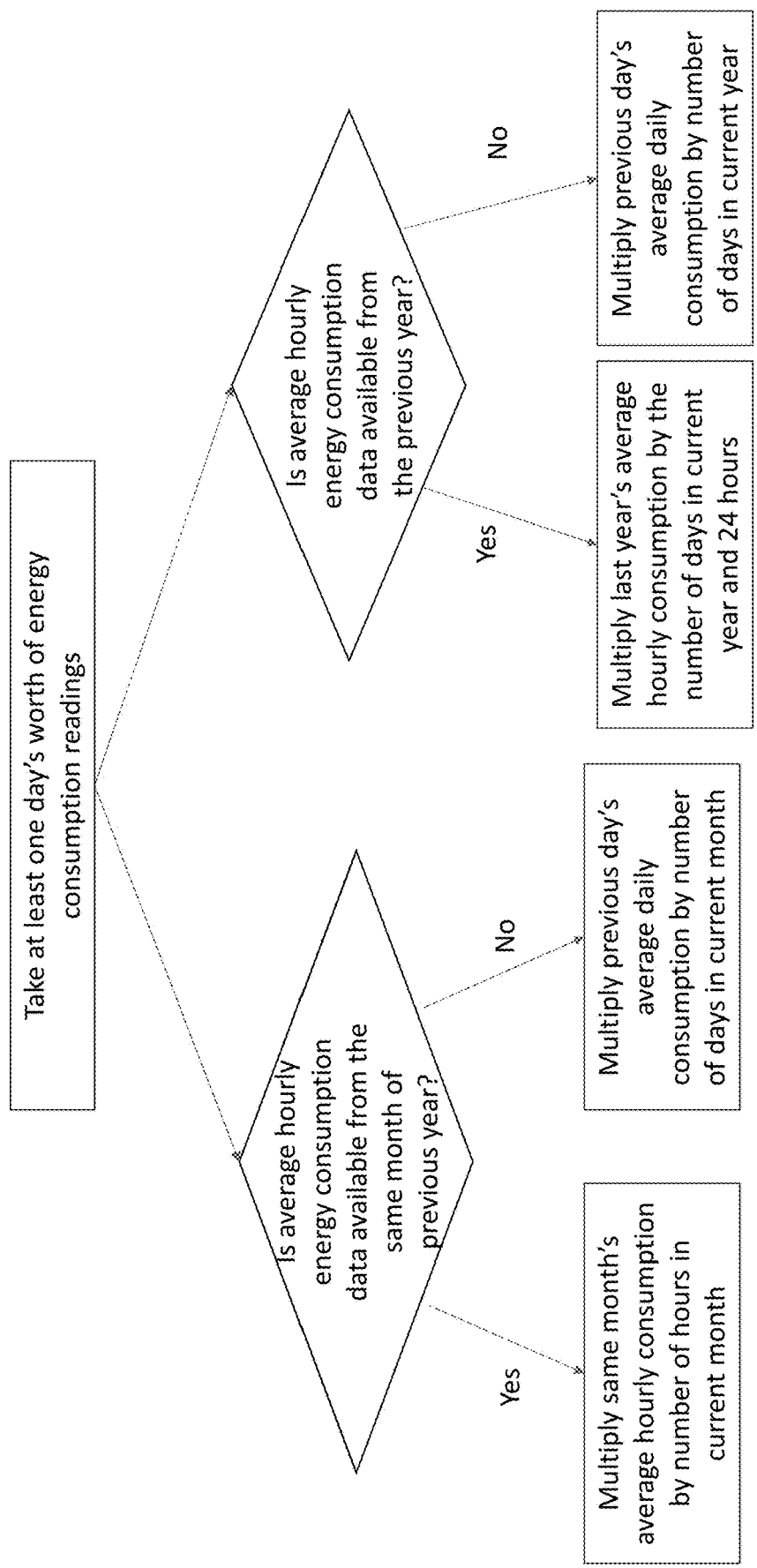
FIG. 10 is a flowchart of exemplary logic that may be used with the simulated electric meter.

As additionally shown in FIG. 10, the processor 62, or the remote electronic device 52, may be configured to project, predict, or otherwise estimate future power consumption

TABLE 1

| Month of the Year | Day of the Month | Daily kwh Value | Cumulative Actual Daily Values for the month | Average Daily Kw Value | Predicted Monthly Kwh Consumption | Days/Given Month | Cumulative Actual Daily Values for the Year | Predicted Yearly Kwh Consumption | Day of the Year |
|---|---|---|---|---|---|---|---|---|---|
| January | 1 | 0.678 | 0.678 | 0.678 | 21.024 | 31 | 0.678 | 247.538 | 1 |
| January | 2 | 0.959 | 1.638 | 0.819 | 25.382 | 31 | 1.638 | 298.855 | 2 |
| January | 3 | 0.428 | 2.066 | 0.689 | 21.349 | 31 | 2.066 | 251.366 | 3 |
| January | 4 | 0.413 | 2.479 | 0.620 | 19.215 | 31 | 2.479 | 226.239 | 4 |
| January | 5 | 0.070 | 2.549 | 0.510 | 15.805 | 31 | 2.549 | 186.086 | 5 |
| January | 6 | 0.724 | 3.273 | 0.546 | 16.912 | 31 | 3.273 | 199.127 | 6 |
| January | 7 | 0.126 | 3.399 | 0.486 | 15.052 | 31 | 3.399 | 177.228 | 7 |
| January | 8 | 0.257 | 3.656 | 0.457 | 14.166 | 31 | 3.656 | 166.797 | 8 |
| January | 9 | 0.681 | 4.337 | 0.482 | 14.939 | 31 | 4.337 | 175.889 | 9 |
| January | 10 | 0.145 | 4.482 | 0.448 | 13.893 | 31 | 4.482 | 163.577 | 10 |
| January | 11 | 0.579 | 5.060 | 0.460 | 14.261 | 31 | 5.060 | 167.907 | 11 |
| January | 12 | 0.905 | 5.966 | 0.497 | 15.411 | 31 | 5.966 | 181.454 | 12 |
| January | 13 | 0.602 | 6.568 | 0.505 | 15.662 | 31 | 6.568 | 184.407 | 13 |
| January | 14 | 0.719 | 7.287 | 0.520 | 16.134 | 31 | 7.287 | 189.970 | 14 |
| January | 15 | 0.971 | 8.257 | 0.550 | 17.065 | 31 | 8.257 | 200.931 | 15 |
| January | 16 | 0.409 | 8.667 | 0.542 | 16.792 | 31 | 8.667 | 197.710 | 16 |
| January | 17 | 0.910 | 9.577 | 0.563 | 17.464 | 31 | 9.577 | 205.629 | 17 |
| January | 18 | 0.499 | 10.076 | 0.560 | 17.354 | 31 | 10.076 | 204.326 | 18 |
| January | 19 | 0.370 | 10.446 | 0.550 | 17.044 | 31 | 10.446 | 200.677 | 19 |
| January | 20 | 0.309 | 10.756 | 0.538 | 16.671 | 31 | 10.756 | 196.292 | 20 |
| January | 21 | 0.401 | 11.156 | 0.531 | 16.469 | 31 | 11.156 | 193.908 | 21 |
| January | 22 | 0.263 | 11.419 | 0.519 | 16.090 | 31 | 11.419 | 189.453 | 22 |
| January | 23 | 0.820 | 12.239 | 0.532 | 16.497 | 31 | 12.239 | 194.233 | 23 |
| January | 24 | 0.472 | 12.711 | 0.530 | 16.418 | 31 | 12.711 | 193.314 | 24 |
| January | 25 | 0.137 | 12.848 | 0.514 | 15.931 | 31 | 12.848 | 187.578 | 25 |
| January | 26 | 0.344 | 13.192 | 0.507 | 15.729 | 31 | 13.192 | 185.198 | 26 |
| January | 27 | 0.974 | 14.166 | 0.525 | 16.265 | 31 | 14.166 | 191.505 | 27 |
| January | 28 | 0.647 | 14.813 | 0.529 | 16.400 | 31 | 14.813 | 193.093 | 28 |
| January | 29 | 0.135 | 14.948 | 0.515 | 15.979 | 31 | 14.948 | 188.135 | 29 |
| January | 30 | 0.157 | 15.105 | 0.504 | 15.609 | 31 | 15.105 | 183.778 | 30 |
| January | 31 | 0.182 | 15.287 | 0.493 | 15.287 | 31 | 15.287 | 179.989 | 31 |
| February | 1 | 0.210 | 0.210 | 0.210 | 5.873 | 28 | 15.497 | 176.757 | 32 |
| February | 2 | 0.467 | 0.677 | 0.338 | 9.475 | 28 | 15.964 | 176.567 | 33 |
| February | 3 | 0.054 | 0.731 | 0.244 | 6.824 | 28 | 16.018 | 171.957 | 34 |
| February | 4 | 0.680 | 1.412 | 0.353 | 9.881 | 28 | 16.698 | 174.139 | 35 |
| February | 5 | 0.551 | 1.963 | 0.393 | 10.991 | 28 | 17.249 | 174.890 | 36 |
| February | 6 | 0.048 | 2.011 | 0.335 | 9.384 | 28 | 17.298 | 170.640 | 37 |
| February | 7 | 0.301 | 2.312 | 0.330 | 9.246 | 28 | 17.598 | 169.036 | 38 | based on past usage. Such estimation may be accomplished by projecting past usage over a future time period, by determining average usage over a period of time, or the like. It is notable that power consumption may vary significantly by time of the year because, for example, of varying weather conditions. For example, without limitation, warmer or cooler ambient air, the number of sunny days, the intensity of the sun, the amount of cloud cover, and the like may affect illumination requirements, cooling requirements, and the like.

If, for example without limitation, data is available regarding average hourly consumption from the same month of a previous year, the same month's average hourly power consumption may be multiplied by the number of hours in the current month to arrive at a predicted monthly consumption. If such data is not available, then the previous day's average daily power consumption may be multiplied by the number of days in the current month to arrive at a predicted monthly consumption. As a further example, again without limitation, if data is available regarding average hourly power consumption from the previous year, the previous year's average consumption may be multiplied by the number of days in the current year and 24 hours to arrive at the predicted annual consumption. If such data is not available, then the previous day's average daily consumption may be multiplied by the number of days in the current year to arrive at the predicted annual consumption. These measurements and predictions are merely exemplary any not intended to be limiting. Any consumption measurements may be used and multiplied by any time period to determine a predicted consumption measurement for a corresponding time period.

At the end of each month, a monthly consumption measurement may be determined by averaging or accumulating all power consumption measurements tracked during the month. For example, without limitation, all daily power consumption measurements tracked during the month may be summed to arrive at a monthly consumption measurement. As another example, again without limitation, all daily power consumption measurement tracked during the month may be summed and divided by the number of measurements taken to arrive at an average daily consumption measurement for the given month. The same or similar measurements may be taken for other time periods such as hours, weeks, days, or years. For example, without limitation, a yearly consumption may be determined by summing all values tracked during the year, all monthly values tracked during the year, or all daily values tracked during the year. These measurements may be stored as described herein.

The simulated electric meter 44 may be in electrical connection with the electronic components 18 or the additional equipment 42. Some of these components may be configured to track the images being shown on the various electronic display subassemblies 12. For example, without limitation, the processor 62, electronic storage device 64, and timing device 66 may be in electronic communication with the video player 18. As a further example, the additional equipment 42 may comprise a proof of play device configured to track what image(s) are shown on the electronic display subassemblies 12.

Regardless, the processor 62 may be configured to monitor the activity of the video player 18. The processor 62 may be further configured store data on the electronic storage device 64, the electronic components 18, the additional equipment 42, or the remote electronic device 52, indicating what was shown on the electronic display subassemblies 12 at given times, which may be measured by the timing device 66. In this way, the simulated electric meter 44 and related components may be configured to measure the power consumed while a particular image or images is displayed on the assembly 10. For example, without limitation, this information may be used to charge advertisers for the power consumed by the assembly 10 while their advertisement is shown on the display. As another example, without limitation, this data may permit an advertiser to better understand the power or power consumed by the assembly 10 and adjust their operations or prices accordingly. This data may be transmitted to the remote electronic device 52.

The illustrated assembly 10 and electronic display subassemblies 12 are merely exemplary. Other size, shape, and configuration assemblies 10 are contemplated with other size, shape, number, and configuration electronic display subassemblies 12.

Any embodiment of the present invention may include any of the optional or preferred features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

What is claimed is:

1. A method for measuring power consumption comprising the steps of:
    providing an assembly comprising a housing, one or more electronic display subassemblies, each comprising one or more light sources located behind or adjacent to an electronic display layer, one or more electrically powered components for operating each of the electronic display subassemblies, and a simulated electric meter electrically interposed between a utility electric supply and at least the light sources and the one or more electrically powered components, said simulated electric meter comprising a processor, an electronic storage device, and a current sensor;
    operating the assembly;
    taking one or more current measurements at the simulated electric meter; and
    determining power consumed by multiplying each of the one or more current measurements with a predetermined voltage amount to determine one or more power consumption measurements.

2. The method of claim 1 further comprising the steps of:
    measuring, by way of a timing device, a time elapsed from when an initial reading from the current sensor was taken; and
    taking current measurements from the current sensor at a given frequency until the time elapsed reaches or exceeds a threshold;
    summing the power consumption measurements taken during the elapsed time and dividing the summed power consumption measurements by the number of power consumption measurements taken to determine an average power consumption measurement for the elapsed time.

3. The method of claim 1 wherein:
the simulated electric meter is interposed between the utility electric supply and all electricity consuming equipment of the assembly.

4. The method of claim 1 further comprising the steps of:
transmitting, by way of a network connection device provided at the assembly, the power consumption measurement to a remote electronic device.

5. The method of claim 1 further comprising the steps of:
hosting a website configured to display the power consumption measurement to a remote electronic device.

6. The method of claim 1 further comprising the steps of:
determining, by way of a video player provided at the assembly, an image currently displayed at the electronic display subassemblies;
recording data regarding the images displayed;
measuring, by way of a timing device, a time elapsed from when the image was first displayed; and
taking current measurements during the elapsed time; and
determining an average power consumption measurement for the elapsed time.

7. The method of claim 1 wherein:
the step of taking one or more current measurements at the simulated electric meter comprises taking a plurality of current measurements.

8. The method of claim 7 further comprising the steps of:
storing each of the power consumption measurements; and
determining an average power consumption measurement.

9. The method of claim 1 wherein:
said housing comprises an intake configured to receive a flow of ambient air and an exhaust configured to exhaust the flow of ambient air; and
the assembly comprises an open loop pathway through the assembly for ambient air.

10. The method of claim 9 wherein:
the assembly comprises a closed loop pathway through the assembly for circulating gas.

11. A method for measuring power consumption comprising the steps of:
providing an assembly comprising a housing, one or more electronic display subassemblies, each comprising one or more light sources located behind or adjacent to an electronic display layer, a number of electricity consuming components, and a simulated electric meter electrically interposed between a utility electric supply and each of the electricity consuming components, said simulated electric meter comprising a processor, an electronic storage device, a current sensor, and a voltage sensor;
operating the assembly;
taking a plurality of current measurements at the simulated electric meter;
taking a plurality of voltage measurements at the simulated electric meter; and
determining the power consumed by multiplying each of the current measurements by each of the voltage measurements to determine a plurality of power consumption measurements.

12. The method of claim 11 further comprising the steps of:
storing each of the plurality of power consumption measurements; and
determining the average power consumed by summing the plurality of power consumption measurements and dividing the summed value by the number of measurements taken.

13. The method of claim 11 wherein:
the electronic display layer comprises liquid crystals; and
the light sources comprise light emitting diodes.

14. The method of claim 11 wherein:
measurements from the current sensor are taken at a first frequency;
measurements from the voltage sensor are taken a second frequency; and
said first frequency is the same as said second frequency.

15. The method of claim 11 wherein:
measurements from the current sensor are taken at a first frequency;
measurements from the voltage sensor are taken a second frequency; and
said first frequency is different from said second frequency.

16. The method of claim 11 wherein:
the electricity consuming components comprise one or more fans.

17. The method of claim 16 wherein:
the assembly comprises an open loop pathway through the assembly for ambient air; and
the assembly comprises a closed loop pathway through the assembly for circulating gas.

18. The method of claim 11 further comprising the steps of:
measuring, by way of a timing device, the time elapsed from when an initial reading from the current sensor is taken; and
summing the power consumption measurements taken during an elapsed period of time and dividing the summed power consumption measures by the number of measurements taken to determine an average power consumption measurement for the elapsed period of time.

19. The method of claim 18 wherein:
the elapsed period of time is equal to the amount of time one or more images are scheduled for display at the assembly.

20. A method for measuring power consumption comprising the steps of:
providing an assembly comprising a housing, one or more electronic display subassemblies, each comprising one or more light sources located behind or adjacent to an electronic display layer, one or more electricity consuming components for operating each of the electronic display subassemblies, said electricity consuming components comprising a video player, and a simulated electric meter electrically interposed between a utility electric supply and electrical connections the electricity consuming components, said simulated electric meter comprising a processor, an electronic storage device, a current sensor, and a voltage sensor;
operating the assembly;
taking a plurality of current measurements at the simulated electric meter;
taking a plurality of voltage measurements at the simulated electric meter;
determining the power consumed by multiplying each of the current measurements by each of the voltage measurements to determine a plurality of power consumption measures;
storing the plurality of power consumption measures; and determining the average power consumed by summing the plurality of power consumption measures and dividing the summed value by the number of measurements taken.

* * * * *

UNITED STATES PATENT AND TRADEMARK OFFICE
CERTIFICATE OF CORRECTION

PATENT NO. : 11,022,635 B2  
APPLICATION NO. : 16/744318  
DATED : June 1, 2021  
INVENTOR(S) : William Dunn et al.

Page 1 of 1

It is certified that error appears in the above-identified patent and that said Letters Patent is hereby corrected as shown below:

On the Title Page

Page 4, item (56) References Cited, Foreign Patent Documents, Reference KR 0313331 B1, please delete "KR" and insert --EP--.

Signed and Sealed this  
Thirteenth Day of July, 2021

Drew Hirshfeld  
*Performing the Functions and Duties of the*  
*Under Secretary of Commerce for Intellectual Property and*  
*Director of the United States Patent and Trademark Office*